United States Patent
Hara

(10) Patent No.: US 9,627,393 B2
(45) Date of Patent: Apr. 18, 2017

(54) HEIGHT REDUCTION IN MEMORY PERIPHERY

(71) Applicant: SanDisk Technologies LLC, Plano, TX (US)

(72) Inventor: Hideki Hara, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/755,904

(22) Filed: Jun. 30, 2015

(65) Prior Publication Data

US 2017/0005105 A1 Jan. 5, 2017

(51) Int. Cl.
| H01L 27/115 | (2006.01) |
| H01L 27/11531 | (2017.01) |
| H01L 27/11529 | (2017.01) |

(52) U.S. Cl.
CPC .. *H01L 27/11531* (2013.01); *H01L 27/11529* (2013.01)

(58) Field of Classification Search
CPC .............. H01L 27/11531; H01L 27/11529
USPC ................... 257/202, 314, 315, 321
See application file for complete search history.

(56) References Cited

U.S. PATENT DOCUMENTS

| 5,570,315 A | 10/1996 | Tanaka et al. |
| 5,774,397 A | 6/1998 | Endoh et al. |
| 5,887,145 A | 3/1999 | Harari et al. |
| 6,046,935 A | 4/2000 | Takeuchi et al. |
| 6,621,425 B2 * | 9/2003 | Maeda ............ G06F 11/006 257/E23.179 |
| 6,979,860 B2 * | 12/2005 | Miwa ............ H01L 27/115 257/202 |
| 7,495,294 B2 | 2/2009 | Higashitani |
| 7,868,376 B2 * | 1/2011 | Aoyama .......... H01L 21/28247 257/324 |
| 7,951,669 B2 | 5/2011 | Harari et al. |
| 9,484,314 B2 | 11/2016 | Shimoda et al. |
| 2006/0001081 A1 * | 1/2006 | Sasago ............ H01L 27/11521 257/316 |
| 2007/0138535 A1 | 6/2007 | Higahitani |
| 2007/0290232 A1 | 12/2007 | Nishiyama |
| 2009/0154240 A1 | 6/2009 | Park et al. |
| 2010/0155959 A1 | 6/2010 | Park et al. |
| 2010/0244269 A1 | 9/2010 | Kim |
| 2011/0049465 A1 * | 3/2011 | Nagashima ........ H01L 27/0207 257/5 |
| 2011/0318931 A1 | 12/2011 | Min et al. |
| 2012/0156841 A1 | 6/2012 | Lee et al. |
| 2012/0168955 A1 | 7/2012 | Chen et al. |
| 2013/0237051 A1 | 9/2013 | Kikutani et al. |
| 2014/0078826 A1 | 3/2014 | Sel et al. |
| 2015/0021790 A1 | 1/2015 | Nagashima et al. |

OTHER PUBLICATIONS

"Notice of Allowance and Fee(s) Due mailed Jul. 28, 2016," U.S. Appl. No. 14/836,730, filed Aug. 26, 2015, 13 pages.

* cited by examiner

*Primary Examiner* — Ori Nadav
(74) *Attorney, Agent, or Firm* — Foley & Lardner LLP

(57) ABSTRACT

A NAND flash memory has word lines in a memory array area and contact pads and lead lines in a word line hookup area, each of the word lines connected to a corresponding contact pad by a lead line. The word lines in the memory array area have a first height and low-profile areas of lead lines in the word line hookup area have a second height that is less than the first height.

10 Claims, 15 Drawing Sheets

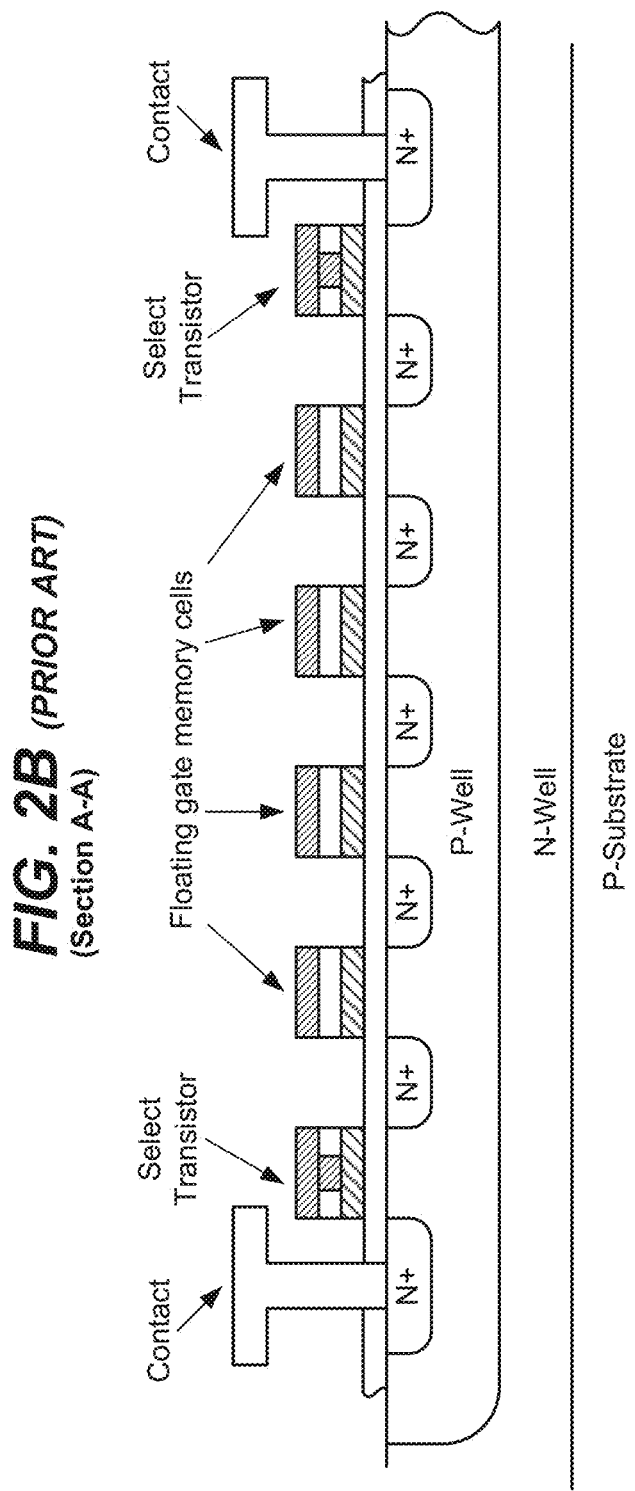

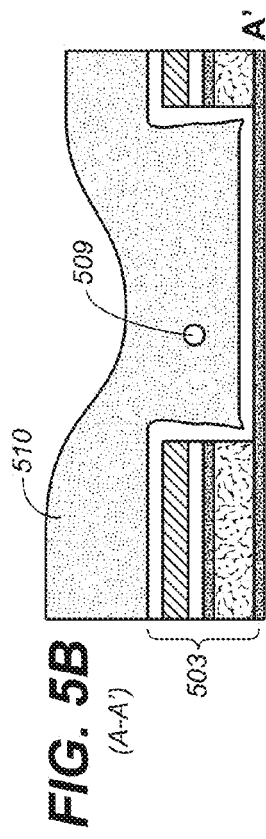
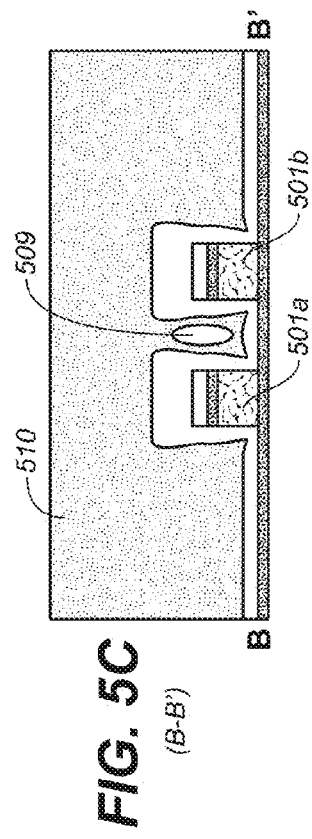
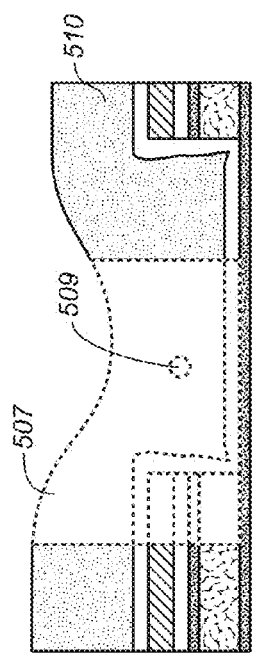
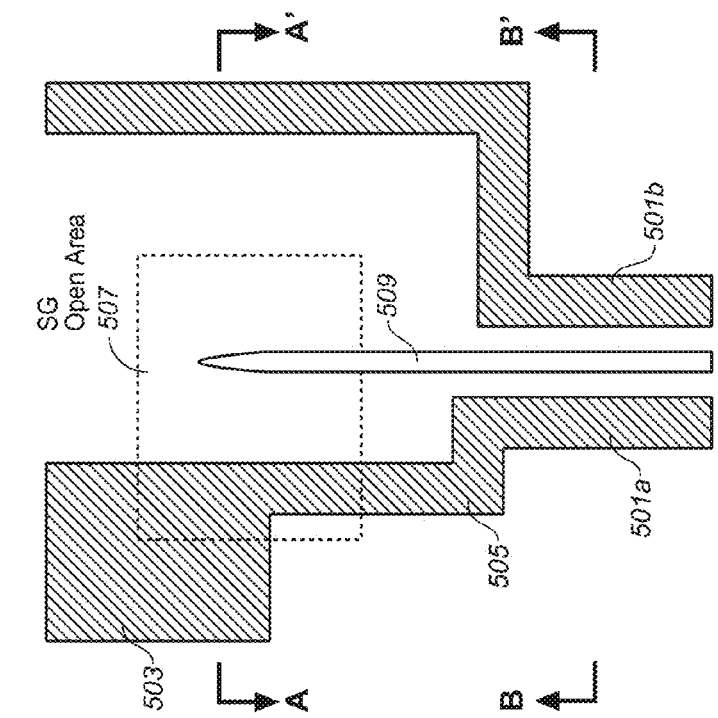
FIG. 5B (A-A')
FIG. 5C (B-B')
FIG. 5D
FIG. 5A

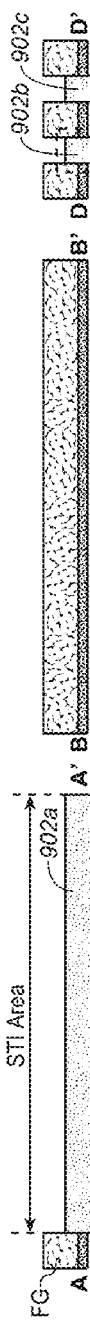
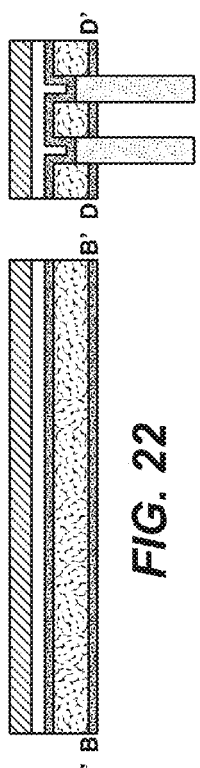
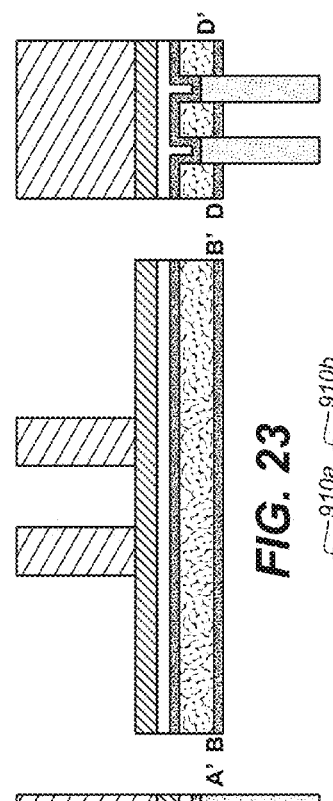
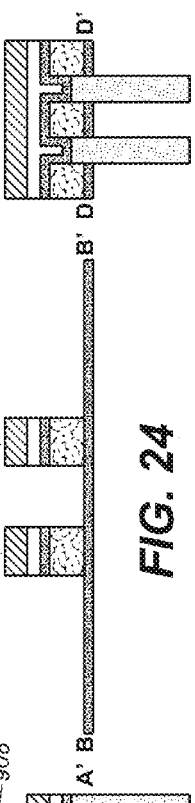
FIG. 21
FIG. 22
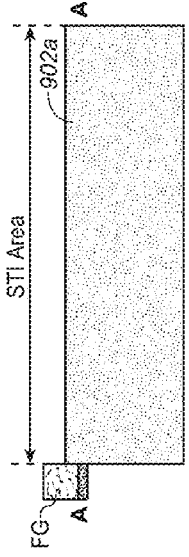
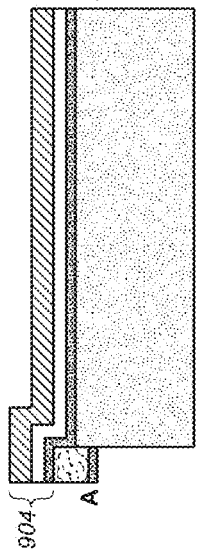
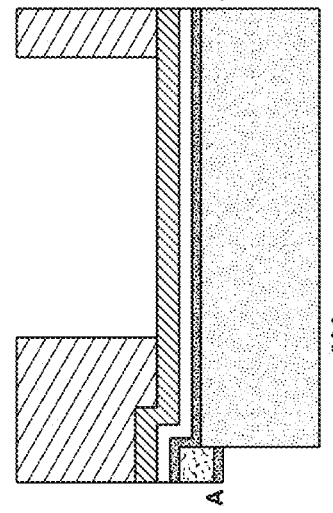
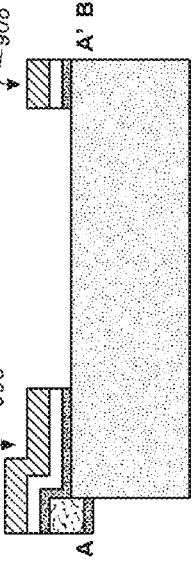
FIG. 23
FIG. 24

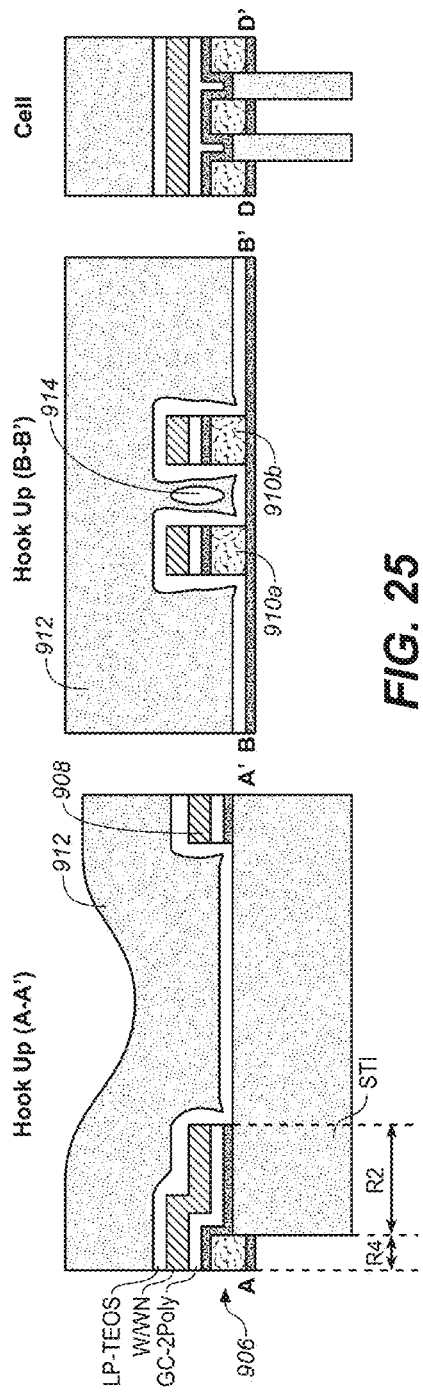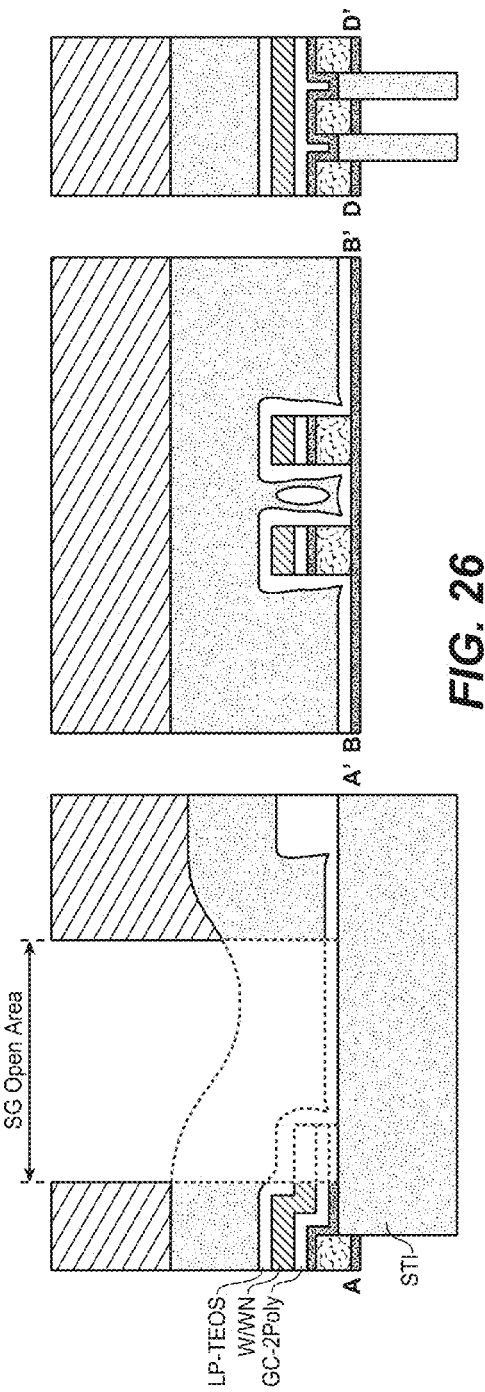

HEIGHT REDUCTION IN MEMORY PERIPHERY

BACKGROUND

This application relates generally to non-volatile semiconductor memories of the flash memory type, their formation, structure and use.

There are many commercially successful non-volatile memory products being used today, particularly in the form of small form factor cards, USB drives, embedded memory, and Solid State Drives (SSDs) which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. Although four floating gate memory cells are shown in each string, the individual strings typically include 16, 32 or more memory cell charge storage elements, such as floating gates, in a column. Control gate (word) lines labeled WL0-WL3 and string selection lines, Drain Select Line, "DSL" and Source Select Line "SSL" extend across multiple strings over rows of floating gates. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel.

The top and bottom of the string connect to the bit line and a common source line respectively through select transistors (source select transistor and drain select transistor). Select transistors do not contain floating gates and are used to connect NAND strings to control circuits when they are to be accessed, and to isolate them when they are not being accessed.

NAND strings are generally connected by conductive lines in order to form arrays that may contain many NAND strings. At either end of a NAND string a contact area may be formed. This allows connection of the NAND string as part of the array. Metal contact plugs (or "vias") may be formed over contact areas to connect the contact areas (and thereby connect NAND strings) to conductive metal lines that extend over the memory array (e.g. bit lines). FIG. 2A shows bit line contacts BL0-BL4 and common source line contacts at either end of NAND strings. Metal lines, such as bit lines, extend over the memory array and in peripheral areas in order to connect the memory array and various peripheral circuits. Word lines also extend over the memory array and into peripheral areas where they connect to contact pads which in turn connect with contact plugs. Areas where word lines are connected to contact pads may be referred to as hookup areas. Transitions from very small dimensions of word lines to larger dimensions of contact areas occur in hookup areas and may present certain challenges.

SUMMARY

In hookup areas adjacent to NAND flash memory arrays, lead lines that connect word lines to contact pads may be formed with reduced height (compared with word lines). When dielectric is deposited over such low-profile lead lines, the reduced height provides a reduced risk of voids being formed. The same dielectric deposition may form voids (air gaps) between higher word lines, with such voids being limited to the memory array area and possibly some limited portion of the hookup area. Subsequent etching through lead lines and adjacent dielectric does not intersect voids. Subsequent wet cleans to not expose voids to chemicals that might propagate along voids (air gaps) between word lines.

An example of a NAND flash memory includes: a plurality of word lines in a memory array area; a plurality of contact pads and lead lines in a word line hookup area, each of the plurality of word lines connected to a corresponding contact pad by a lead line; and the plurality of word lines in the memory array area have a first height and low-profile areas of lead lines in the word line hookup area have a second height that is less than the first height.

The low-profile areas may not include any interpoly dielectric (IPD) thereby reducing the second height relative to the first height by an amount that is at least equal to IPD thickness. The low-profile areas may contain a reduced thickness of floating gate polysilicon thereby reducing the second height relative to the first height by an amount that is equal to the IPD thickness, plus a portion of floating gate thickness. The low-profile areas may not include any floating gate polysilicon thereby reducing the second height relative to the first height by an amount that is equal to floating gate layer thickness. The shallow trench isolation structures may extend under the low-profile areas of the lead lines in the word line hookup area. Openings may extend through lead lines, each of the openings extending through a corresponding low-profile area to isolate a contact pad from a word line. An individual low-profile area may encompass an individual opening and the individual opening may extend through an individual lead line at least a minimum distance from a perimeter of the individual low-profile area. The individual opening may extend through a dielectric material that lies between neighboring lead lines. The low-profile areas may extend to pads so that at least portions of the pads have the second height.

An example of a method of forming a NAND flash memory array includes: forming a floating gate polysilicon layer; forming an interpoly dielectric (IPD) layer directly on the floating gate polysilicon layer; subsequently removing the IPD layer from first areas where select lines are to be formed and from second areas in word line hookup areas; subsequently forming a control gate polysilicon layer directly on the IPD layer, the control gate polysilicon layer lying in direct contact with the floating gate polysilicon layer in the first and second areas; and subsequently patterning the control gate polysilicon layer, the IPD layer, and the floating gate polysilicon layer to form word lines and select lines in a memory array area and to form word line pads and lead lines in word line hook up areas.

At least some of the floating gate polysilicon layer may be removed from the second areas in the word line hookup areas. The control gate polysilicon height above a substrate surface in the second areas may be less than control gate polysilicon height above the substrate surface in the first areas by an amount that is at least equal to IPD layer thickness plus some floating gate thickness. Removing at least some of the floating gate polysilicon layer may include performing a series of polysilicon etching steps and resist slimming steps to form a stairs-like floating gate polysilicon profile that descends into the second areas. Removing at least some of the floating gate polysilicon layer may include performing isotropic polysilicon etching to form a tapering polysilicon profile that descends into the second areas. The lead lines may be cut at predetermined locations to electrically separate pads from unconnected word lines. The cutting may include anisotropic etching at second areas where IPD was previously removed. The patterning may use sidewall spacers to form word lines having dimensions smaller than a minimum feature size formed by direct patterning.

An example of a method of forming a NAND flash memory array includes: forming a floating gate polysilicon layer over a substrate; subsequently removing the floating gate polysilicon layer, and a portion of substrate material from first areas in a memory array areas where shallow trench isolation (STI) structures are to be formed between NAND strings and from second areas in word line hook up areas; subsequently depositing dielectric material in the first areas and second areas; subsequently forming a control gate layer over the substrate and over the dielectric material in the first and second areas; and subsequently patterning the control gate layer to form word lines and select lines in the memory array area and to form word line pads and lead lines in the word line hook up areas.

The lead lines may be etched through in the second areas. Upper surfaces of the lead lines may be lower in the second areas than upper surfaces of the word lines in the memory array area by approximately the floating gate polysilicon layer thickness.

Various aspects, advantages, features and embodiments are included in the following description of examples, which description should be taken in conjunction with the accompanying drawings.

BRIEF DESCRIPTION OF THE DRAWINGS

FIG. 2B shows a cross section of the NAND array of FIG. 2A.
FIGS. 5A-D illustrate etching that exposes voids.
FIG. 21 shows the structure of FIG. 20 after etching back to recess STI structures.
FIG. 22 shows the structure of FIG. 21 after deposition of IPD and control gate layers.
FIG. 23 shows the structure of FIG. 22 after patterning.
FIG. 24 shows the structure of FIG. 23 after etching.
FIG. 25 shows the structure of FIG. 24 after deposition of a dielectric layer.
FIG. 26 shows the structure of FIG. 25 including etch location.

DETAILED DESCRIPTION OF EXEMPLARY EMBODIMENTS

Memory System

Figure 1:
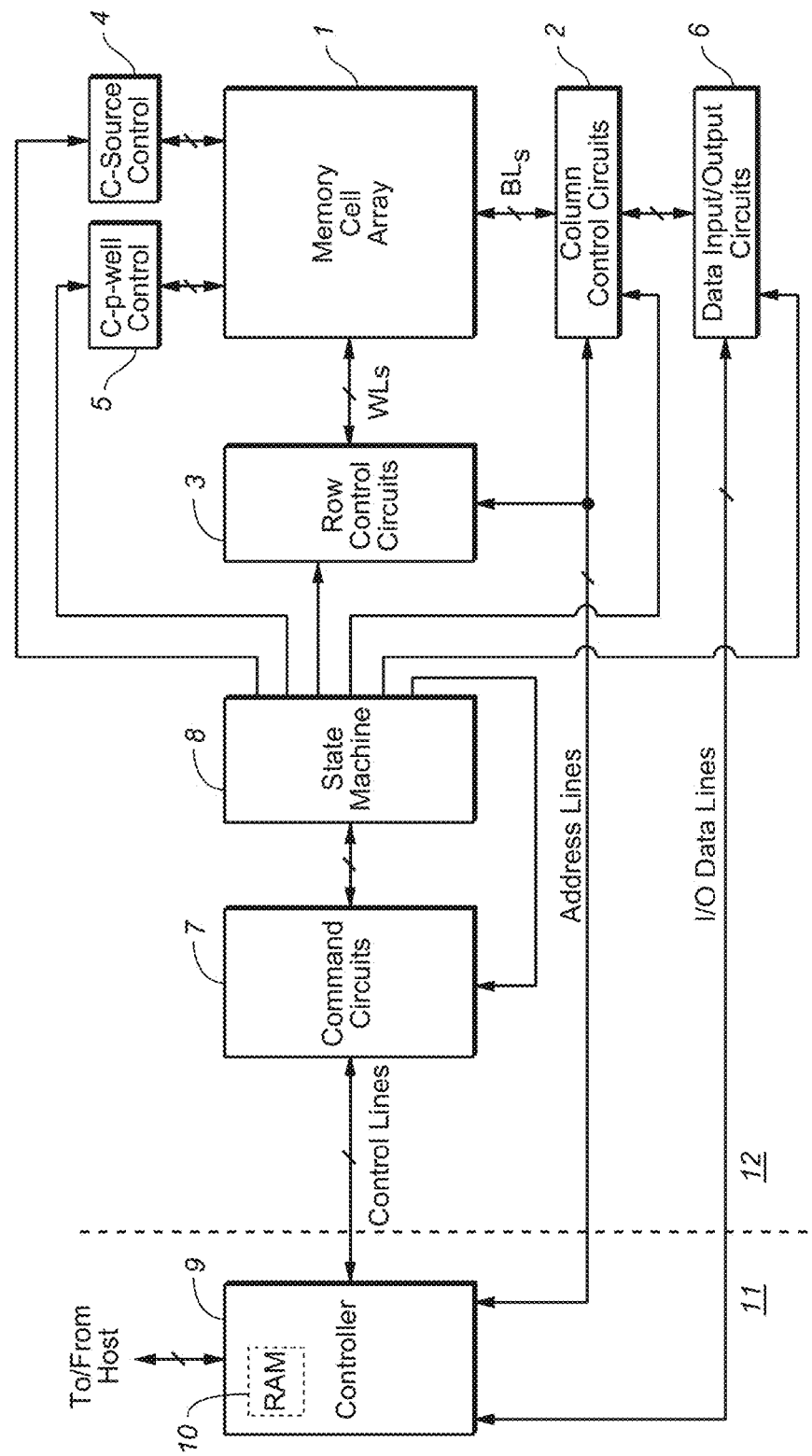
FIG. 1 is a block diagram of a prior art memory system.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

In other embodiments, types of memory other than the two dimensional and three dimensional exemplary structures described here may be used.

An example of a prior art memory system, which may be modified to include various structures described here, is illustrated by the block diagram of FIG. 1. A planar memory cell array 1 including a plurality of memory cells is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells, for determining a state of the memory cells during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells are formed. The c-source control circuit 4 controls a common source line (labeled as "c-source" in FIG. 1) connected to the memory cells (M). The c-p-well control circuit 5 controls the c-p-well voltage.

The data stored in the memory cells are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. The memory system of FIG. 1 may also be used in a Solid State Drive (SSD) or similar unit that provides mass data storage in a tablet, laptop computer, or similar device. Memory systems may be used with a variety of hosts in a variety of different environments. For example, a host may be a mobile device such as a cell phone, laptop, music player (e.g. MP3 player), Global Positioning System (GPS) device, tablet computer, or the like. Such memory systems may be inactive, without power, for long periods during which they may be subject to various conditions including high temperatures, vibration, electromagnetic fields, etc. Memory systems for such hosts, whether removable or embedded, may be selected for low power consumption, high data retention, and reliability in a wide range of environmental conditions (e.g. a wide temperature range). Other hosts may be stationary. For example, servers used for internet applications may use nonvolatile memory systems for storage of data that is sent and received over the internet. Such systems may remain powered up without interruption for extended periods (e.g. a year or more) and may be frequently accessed throughout such periods. Individual blocks may be frequently written and erased so that endurance may be a major concern.

Figure 2A:
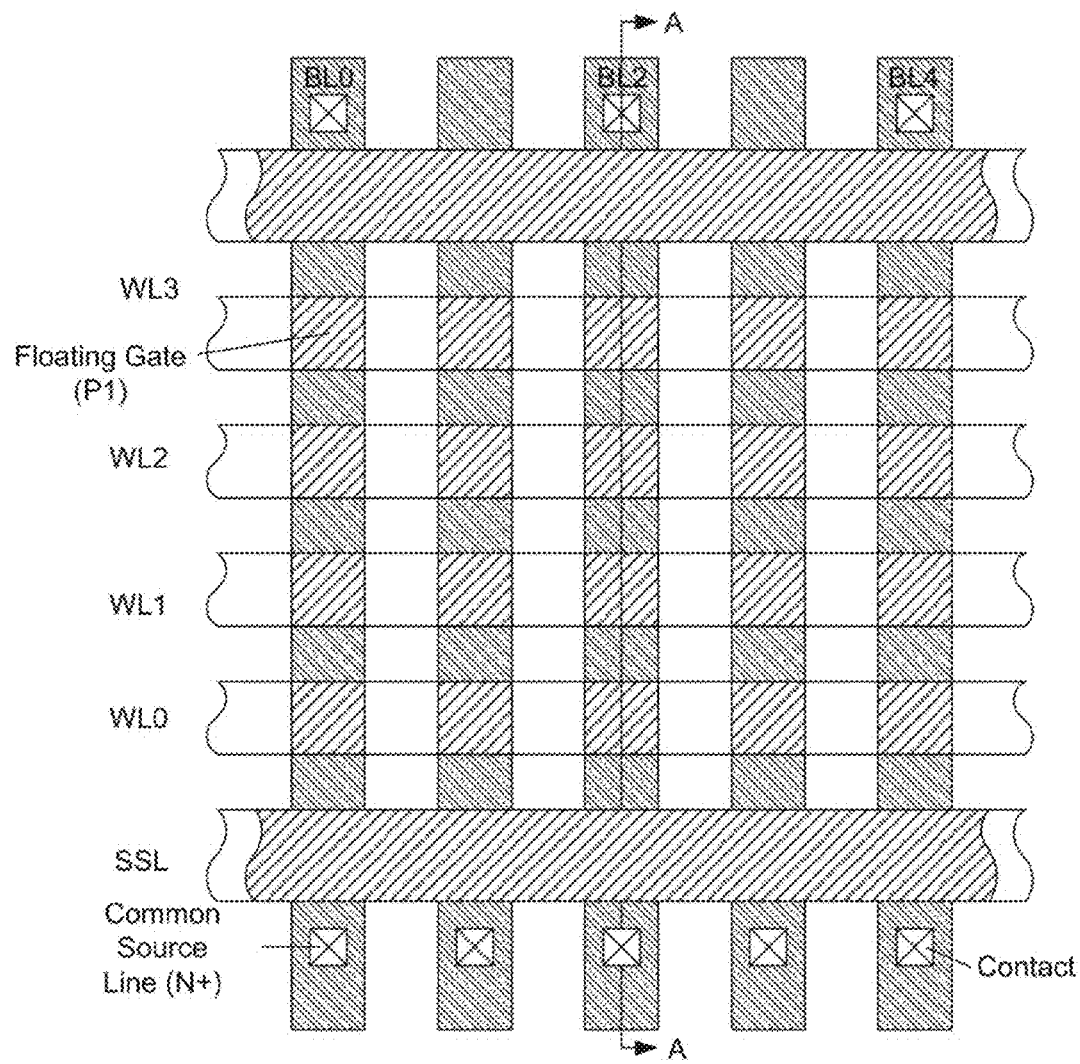
FIG. 2A is a plan view of a prior art NAND array.

FIGS. 2A-2B show different views of a prior art NAND flash memory. In particular, FIG. 2A shows a plan view of a portion of such a memory array including bit lines and word lines (this is a simplified structure with a small number of word lines and bit lines). FIG. 2B shows a cross section along A-A (along a NAND string) showing individual memory cells that are connected in series. Contact plugs, or vias, are formed at either end to connect the NAND strings in the memory array to conductive lines (e.g. connecting to bit lines at one end and to a common source line at the other end). Word lines extend to hookup areas where contact pads are formed that allow word lines to be connected to word line driver circuits.

Figure 3:
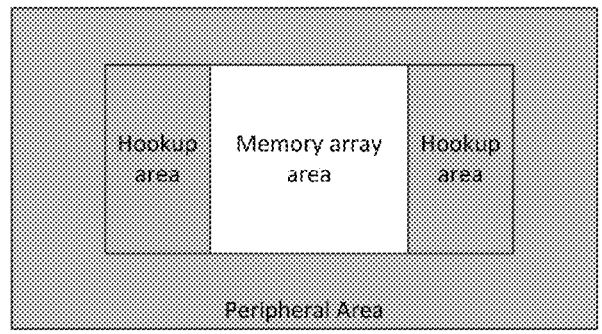
FIG. 3 illustrates peripheral areas, including hookup areas, and a memory array area.

FIG. 3 illustrates a portion of a memory die that includes a memory array area where NAND strings are located, with a peripheral area (shaded) around the memory array area. Within the peripheral area, on either side of the memory array area, are hookup areas where word lines connect with contact pads to allow connection to peripheral circuits. Such a layout, with word line hookup areas on either side of a memory array area is an arrangement that allows a large number of contact pads to be located relatively close to the memory cells so that resistance is low. Other arrangements may also be used.

One way to form word lines is by using sidewall spacers to define features (including word lines) with dimensions that are smaller than achievable using direct photolithographic patterning. Sidewall Assisted Processing (SAP) may form sidewall spacers along sides of mandrels and then remove the mandrels leaving a pattern of sidewall spacers. This pattern may define a second (smaller) pattern of mandrels and the sidewall formation process may be repeated in what may be referred to as Double Sidewall Assisted Processing (DSAP).

Spacing between such word lines may be very small (i.e. may be significantly less than the minimum spacing that can be achieved by direct patterning). Such small spacing may provide significant capacitive coupling between word lines. A suitable dielectric between word lines may maintain capacitive coupling below a limit. In some memory arrays, air gaps are formed between word lines to keep capacitive coupling low. However, connecting such small word lines separated by air gaps with much larger structures, such as contact pads, may provide certain challenges.

Figure 4A:
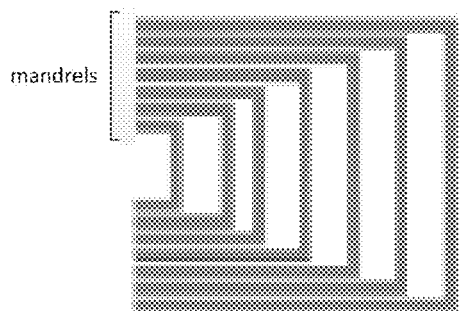
FIGS. 4A-C illustrate an example of sidewall assisted processing.
Figure 4B:
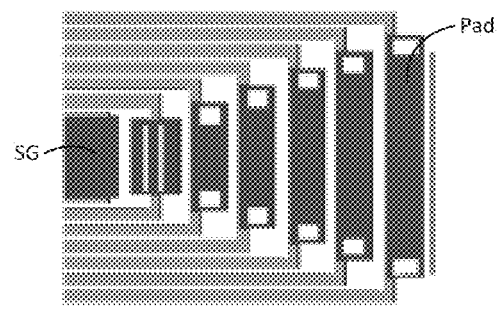
Figure 4C:

FIGS. 4A-C illustrate an example of certain steps in forming word lines and contact pads in a hookup area of a NAND flash memory. FIG. 4A shows portions of mandrels that are formed as concentric closed loops (mandrels extend across the memory array area in parallel and may have a pattern on the opposite side of the memory array that is the mirror image of the pattern of FIG. 4A). FIG. 4B shows the mandrels of FIG. 4A after patterning to form photoresist portions that define contact pad areas and select gate ("SG") areas. The pattern of FIG. 4B may be used to define mandrels that are used to form sidewall spacers extending over the memory array area (where they define word lines) and into the hookup area (where they define lead lines). FIG. 4C illustrates a step that cuts lead lines so that each contact pad remains connected with a single word line. It will be understood that a corresponding pattern is also cut on the other side of the memory array area so that upper word lines of FIG. 4C have contact pads at the other side of a memory array area. Select gate structures are also cut ("SG cut") into two select lines by this step.

Because sidewall spacers are formed as loops in the example above, and each loop defines two word lines, some cutting of these loops is needed in order to avoid having two word lines shorted together. This cutting may be performed in a hookup area close to a contact pad. Cutting may be performed on either side so that two electrically separate structures are formed, each structure having one contact pad connected by a lead line to a corresponding word line. Other patterning may have different cutting arrangements.

FIG. 5A illustrates a top-down view of a portion of a hookup area where a word line 501a and a contact pad 503 are connected by a lead line 505. A patterned etch is used to cut lead line 505 and thus disconnect contact pad 503 from word line 501a. An etch mask exposes an open area 507 ("SG open area") in which etching proceeds through the conductive layers (e.g. control gate and floating gate layers) so that electrical connection is broken between contact pad 503 and word line 501. Open area 507 also extends laterally beyond lead line 505 to provide a margin for alignment error and ensure that there is no current leakage. It will be understood that open area 507 illustrated in FIG. 5A may be one of many such openings that selectively disconnect contact pads from word lines to leave connected pairs of contact pads and word lines.

FIG. 5A shows an air gap, or void 509, extending between word lines 501a-b. Such air gaps help to reduce capacitive coupling. Void 509 does not terminate immediately in the hookup area. As lead lines diverge and the spacing between them becomes wider, the void does not stop abruptly but continues some distance and then terminates.

FIGS. 5B and 5C illustrate void 509 in cross section. FIG. 5B shows a cross section along A-A' of FIG. 5A and FIG. 5C shows a cross section along B-B' of FIG. 5A. It can be seen that void 509 extends through dielectric 510 into the hookup area to A-A' in FIG. 5B. Subsequently, when etching is performed in the hookup area, for example, to disconnect word lines from contact pads, such voids can be problematic.

FIG. 5D illustrates open area 507 that is etched through the layers shown, down to an upper surface of the substrate. Open area 507 intersects void 509 so that some etchant (e.g. etch gas) may penetrate into void 509. Subsequent to the etching, one or more cleaning steps may be performed to remove etch residue or other material. Chemicals used for such cleaning (e.g. liquid chemicals used for wet clean) may also penetrate from open area 507 through void 509. When etch chemicals, cleaning chemicals, or other materials enter void 509 there may be undesirable consequences. In particular there may be damage to word lines 501a-b on either side of void 509 which may affect electrical characteristics of word lines and cause increased failure rates. For example, hydrofluoric acid (HF) used in some wet cleans may be corrosive to tungsten used for word lines. Corrosion of tungsten word lines by HF may result in increased word line resistance or breaks in word lines. Elution of tungsten may provide material in voids that create pathways for electrical current thus causing word line-to-word line leakage.

FIGS. 6A-D illustrate an alternative hookup area structure in which voids do not extend significantly into the hookup. In particular, a low-profile area 611 is formed so that word lines, lead lines, and contact pads are lower in low-profile area 611 than in other areas. By lowering the height of these structures, the aspect ratio of any spaces between such structures is lowered and the tendency to form voids is reduced.

Figure 6A:
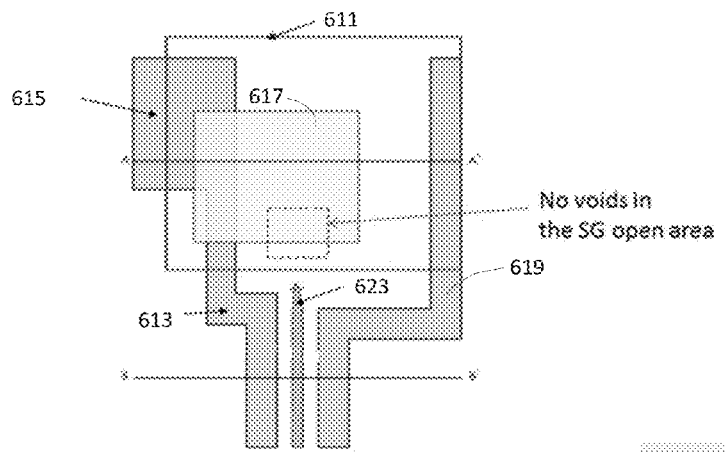
FIGS. 6A-D illustrate an example of etching that does not expose voids.

FIG. 6A illustrates a low-profile area 611 that extends to include a significant portion of lead line 613 and contact pad 615, and fully encompass the location where open area 617 is etched. Thus, etching of open area 617 proceeds through areas where height was reduced prior to deposition of dielectric with at least some minimum distance between the boundary of the open area and the boundary of the low-profile area. Gaps between lead lines 613, 619 in such low-profile areas have reduced aspect ratios as a result of this lowering so that filling of gaps is improved and void formation is reduced. Accordingly, areas where voids were likely without such lowering (as shown in FIG. 5A) may be void free as shown in FIG. 6A. Thus, when open area 617 is formed by etching within low-profile area 611, no voids are encountered.

Figure 6B:
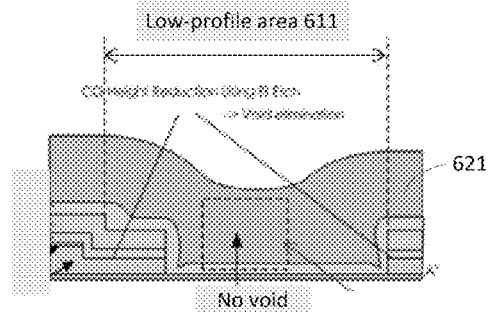
Figure 6C:
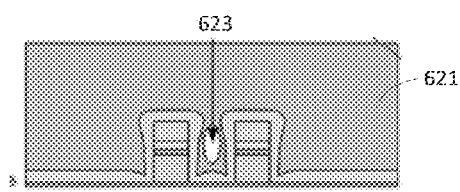

FIG. 6B illustrates low-profile area 611. No void is present in this cross section along A-A' because of void free filling with dielectric 621. Air gap 623 remains between word lines remain as before (as in FIG. 5C) because of the relatively high aspect ratio of gaps between word lines as shown in FIG. 6C. Thus, while air gap 623 may extend some distance into hookup area, it extends less distance as a result of reduced lead line height in low-profile area 611. By reducing height adequately and positioning the low-profile area appropriately, voids may be limited so that open areas are adequately separated from voids thereby ensuring that no exposure of voids occurs during etching of open areas.

Figure 6D:
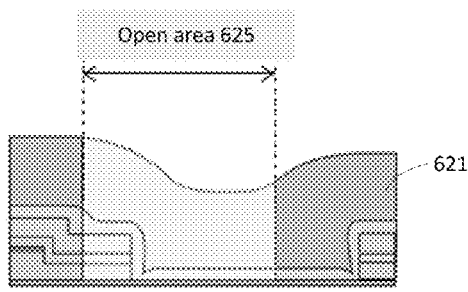

FIG. 6D illustrates etching of open area 625 during which no void is encountered. Thus, void 623 remains unexposed so that no etchant or cleaning material enters void 623.

While the examples of FIGS. 5-6 illustrate a particular arrangement of word lines, lead lines, and contact pads, it will be understood that word lines and other conductive lines may connect with contact pads in a number of arrangements that may present a risk of exposing voids if the voids are not adequately separated from etched areas. Forming low-profile areas may be used in various arrangements and is not limited to a particular geometry or to particular layer structure.

Structures employing low-profile areas, such as described above, may be formed in various ways. Specific examples of processes steps that may be used are described below. It will be understood that any suitable process may be used and that the following are merely examples.

FIGS. 7-14 illustrate certain process steps according to an example in which a NAND flash memory is formed with low-profile areas in a hookup region.

Figure 7:
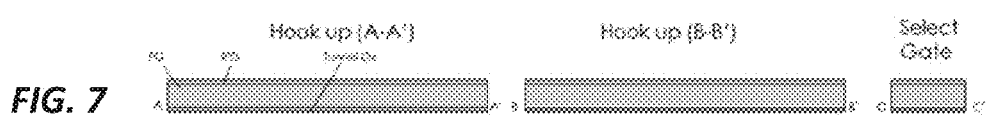
FIG. 7 shows a substrate at an intermediate stage of fabrication.

FIG. 7 shows a substrate at an intermediate stage of fabrication after deposition of interpoly dielectric (IPD), floating gate (FG) polysilicon, and tunnel oxide, on a silicon substrate. FIG. 7 shows the substrate in cross section at three locations, in the hookup area where an open area is to be formed (corresponding to A-A' of FIG. 6A), between word lines where word lines enter the hookup area (corresponding to B-B' of FIG. 6A) and in a select gate area (not shown in FIG. 6A).

Figure 8:
FIG. 8 shows the structure of FIG. 7 patterning.

FIG. 8 shows the structure of FIG. 7 after formation of a photoresist ("Resist") pattern (e.g. by spinning-on photoresist and using photolithography to pattern and selectively remove portions of the photoresist). A wide opening 831 in the photoresist is formed in the hookup area and a narrow opening 833 is formed in the select gate area.

Figure 9:
FIG. 9 shows the structure of FIG. 8 after etching.

FIG. 9 shows the structure of FIG. 8 after etching and resist removal. Etching according to the pattern of FIG. 8 (i.e. using the photoresist pattern as an etch mask) results in an open area ("EI open area") 835 in which IPD layer is etched through (i.e. where no IPD material remains) and a significant thickness of FG layer is also removed. IPD layer is also etched through in the select gate area and a significant thickness of FG layer is removed there (region R11). Forming openings through IPD is a known way to form select gates and thus open areas in the hookup area may be formed in parallel without any additional process steps (i.e. using the same patterning and etching).

Figure 10:
FIG. 10 shows the structure of FIG. 9 after deposition of IPD and control gate layers.

FIG. 10 illustrates subsequent deposition of control gate layers. In this example, control gate polysilicon layer ("GC poly") and control gate metal layer (tungsten with a tungsten nitride barrier "W/WN") form the control gate. Other materials may also be used. It can be seen that control gate polysilicon layer directly contacts FG polysilicon layer in open area 835 and in the select gate area, while the IPD layer separates control gate polysilicon layer from FG polysilicon layer in the array area as shown along B-B' (along boundary of hookup area and array area). It can be seen that there is a significant height reduction in open area 835 compared with other areas (reduced by IPD thickness plus removed FG polysilicon thickness).

Figure 11:
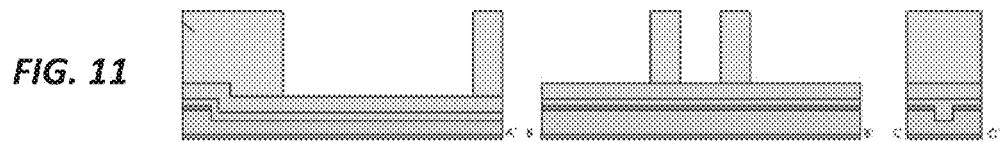
FIG. 11 shows the structure of FIG. 10 after patterning.

FIG. 11 illustrates subsequent formation of a photoresist pattern that defines contact pads, word lines, lead lines and select gate structures.

Figure 12:
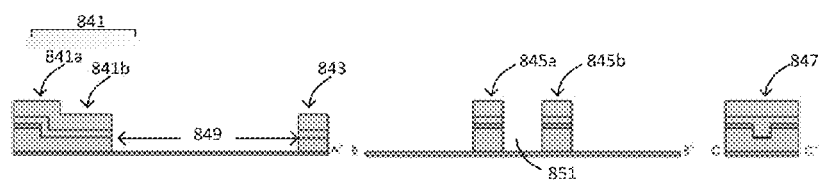
FIG. 12 shows the structure of FIG. 11 after etching.

FIG. 12 illustrates the structure after etching according to the pattern of FIG. 11. It can be seen that a contact pad 841 and lead line 843 are formed in the hookup area with reduced height compared with word lines 845*a-b* and select line 847. Part 841*a* of the contact pad shown has the same height as word lines 845*a-b* (i.e. includes all FG layer and IPD layer) while another part 841*b* of the contact pad has a low-profile. The low-profile part 841*b* is along gap 849 between the contact pad and lead line 843. Thus, gap 849 has a low aspect ratio because it has relatively low sides. In contrast, gap 851 between word lines 845*a-b* has a relatively high aspect ratio.

Figure 13:
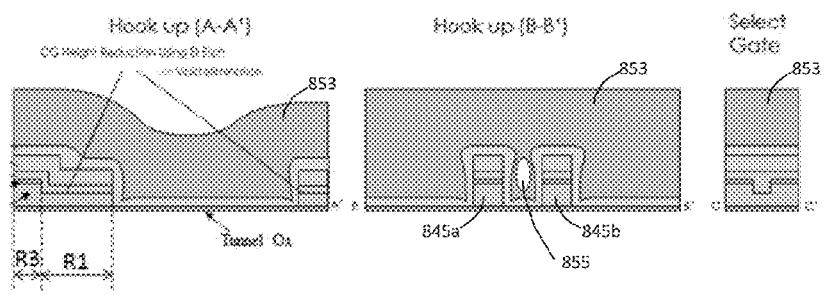
FIG. 13 shows the structure of FIG. 12 after deposition of a dielectric layer.

FIG. 13 illustrates deposition of dielectric layer 853 over the structure of FIG. 12. Dielectric layer 853 fills gap 849 without voids. Because of the low aspect ratio of gap 849 the risk of voids extending into this area is low. An air gap 855 (void) extends between word lines 845*a-b* where gap 851 had a relatively high aspect ratio.

Figure 14:
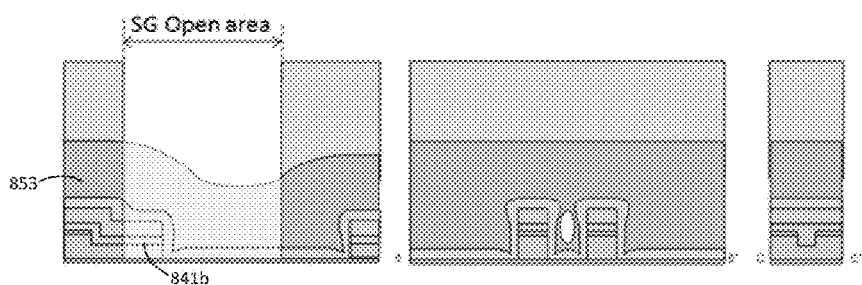
FIG. 14 shows the structure of FIG. 13 including an opening in a void free area.

FIG. 14 illustrates where etching occurs ("SG open area") to separate word lines from contact pads. Etching extends through part 841*b* of contact pad 841 where it has a low-profile and through dielectric layer 853. No voids are encountered so that any air gaps between word lines, such as air gap 855, remain intact (i.e. are not exposed).

It can be seen that, in the hookup area, control gate layers are connected to floating gate polysilicon by removal of IPD while these layers remain separated in the memory array area. This allows separate floating gates in the memory array area. Connecting these layers in the hookup area may help to reduce resistance by providing a larger cross section for electrical current to flow (i.e. FG poly in parallel with CG layers). These layers are similarly connected in the select gate area to form unified select gates.

Figure 15:
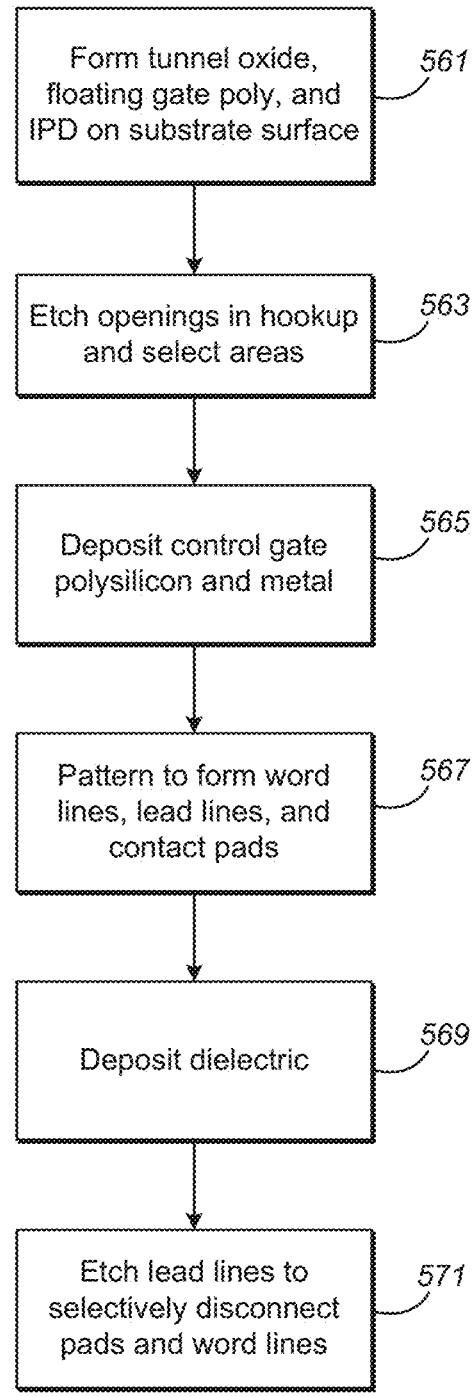
FIG. 15 shows an example of steps used to form a NAND flash memory with low-profile regions in hookup areas.

FIG. 15 illustrates an example of steps used to form a NAND flash memory. A stack of layers is formed 561 on a substrate surface including a tunnel oxide layer, floating gate layer, and IPD layer. Then, openings are etched 563 through the IPD layer and at least partially through the floating gate layer in the hookup area and in select gate areas. Control gate polysilicon and metal (e.g. tungsten) are deposited 565. Then patterning 567 forms separate word lines, lead lines, and contact pads with gaps in hookup areas having a low aspect ratio. A dielectric layer is deposited 569 to fill the low aspect ratio gaps while capping air gaps (voids) in relatively high aspect ratio gaps between word lines. Subsequently, etching is performed 571 to selectively separate word lines and contact pads. Where this etching extends through low-profile areas, the risk of exposing voids is low and thus the risk of unwanted materials entering such voids and causing damage is correspondingly low.

While the above example provides low-profile areas by etching portions of hookup areas in parallel with etching to form select gates, low-profile areas may be formed in any suitable manner. Separate patterning and etching or other steps may be used to form such low-profile areas. In some cases, formation of low-profile areas may be combined with different steps so that the number of steps may be relatively low.

FIGS. 16-26 illustrate another example of formation of a NAND flash memory array with low-profile areas in hookup areas.

Figure 16:
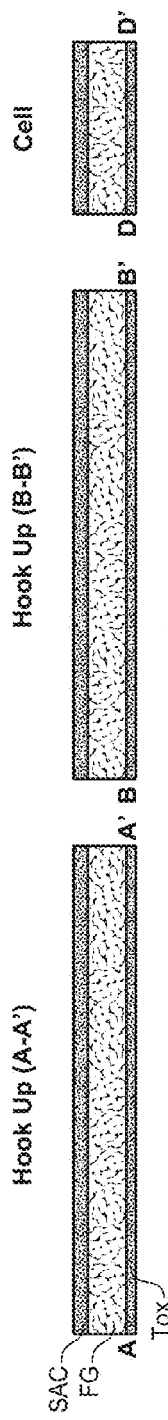
FIG. 16 shows a substrate at an intermediate stage of fabrication.

FIG. 16 shows a substrate with tunnel oxide layer ("Tax"), floating gate ("FG") polysilicon layer, and sacrificial dielectric layer ("SAC").

Figure 17:
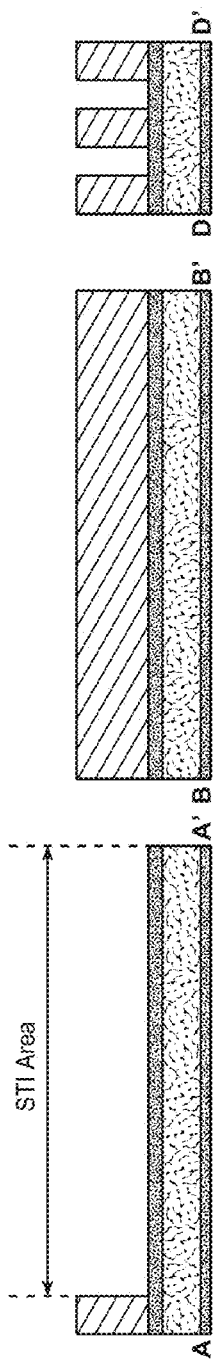
FIG. 17 shows the structure of FIG. 16 after patterning.

FIG. 17 shows the substrate of FIG. 16 after patterning to define a large shallow trench isolation ("STI area") in the hookup area and to define active areas and STI areas in the memory array area (cell area). The STI areas may have a pattern corresponding to EI open area of FIG. 6A.

Figure 18:
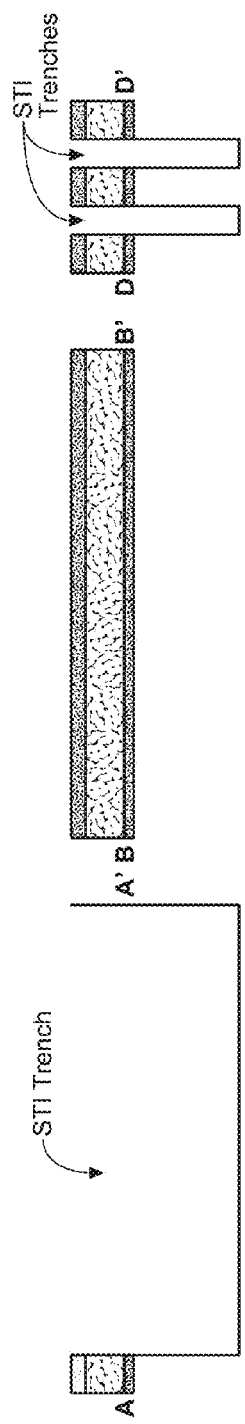
FIG. 18 shows the structure of FIG. 17 after etching to form trenches.

FIG. 18 shows the substrate of FIG. 17 after etching according to the pattern of FIG. 17 to remove dielectric layer, FG polysilicon layer, tunnel oxide layer and a portion of substrate in exposed areas. Thus, STI trenches are formed in the memory array area to separate active areas of neighboring NAND strings and a large STI trench is formed in the hookup area.

Figure 19:
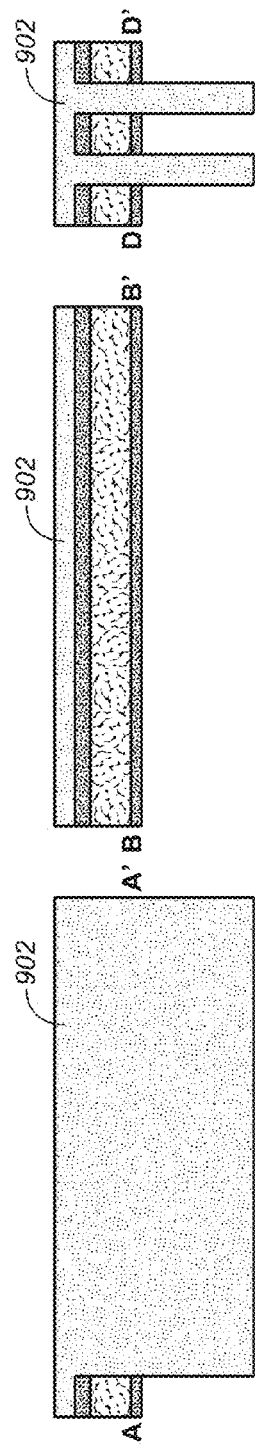
FIG. 19 shows the structure of FIG. 18 after deposition of silicon oxide.

FIG. 19 illustrates subsequent filling of STI trenches with a dielectric material 902, which in this case is silicon oxide (SiO2).

Figure 20:
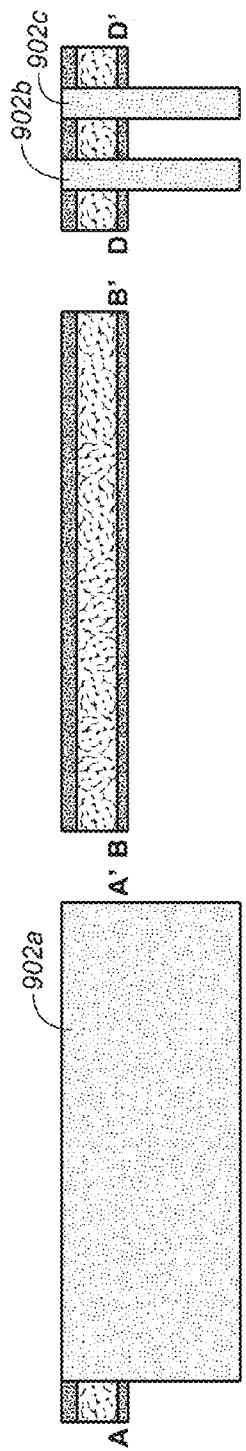
FIG. 20 shows the structure of FIG. 19 after planarization.

FIG. 20 illustrates planarization of the dielectric material 902 to leave portions 902a-c of dielectric material in STI trenches while removing dielectric material that overlies sacrificial layer portions. Planarization may use chemical mechanical polishing (CMP) and/or etching.

FIG. 21 illustrates etching back of dielectric material portions 902a-c below the level of the top surface of FG polysilicon layer. The sacrificial layer is also removed by this etching. Etching may use high density plasma (HDP) etching or another suitable etch process.

FIG. 22 illustrates deposition of a stack 904 including IPD layer, control gate polysilicon layer, and control gate metal layer.

FIG. 23 illustrates patterning of the structure of FIG. 22 and FIG. 24 illustrates the results of etching according to the pattern of FIG. 23. A contact pad 906 and lead line 908 are formed with relatively low height (thickness of IPD layer, control gate polysilicon, and control gate metal). Word lines 910a-b are formed that are relatively higher (including floating gate polysilicon) and closer together and thus are separated by a gap that has a higher aspect ratio than a gap between contact pad 906 and lead line 908.

FIG. 25 illustrates subsequent deposition of a dielectric layer 912 that fills the opening between contact pad 906 and lead line 908 without voids. In particular, the relatively low height of contact pad 906 and lead line 908 on either side of the opening provides a low aspect ratio gap that is conducive to void free filling. In contrast, air gap 914 is formed between word lines 910a-b, which are higher and more closely spaced.

FIG. 26 illustrates subsequent etching to selectively separate word lines and contact pads by etching through lead lines. It can be seen that the etched area ("SG open area") having an extent as shown in FIG. 6A does not intersect any void and that air gap (void) between word lines remains unexposed.

Figure 27:
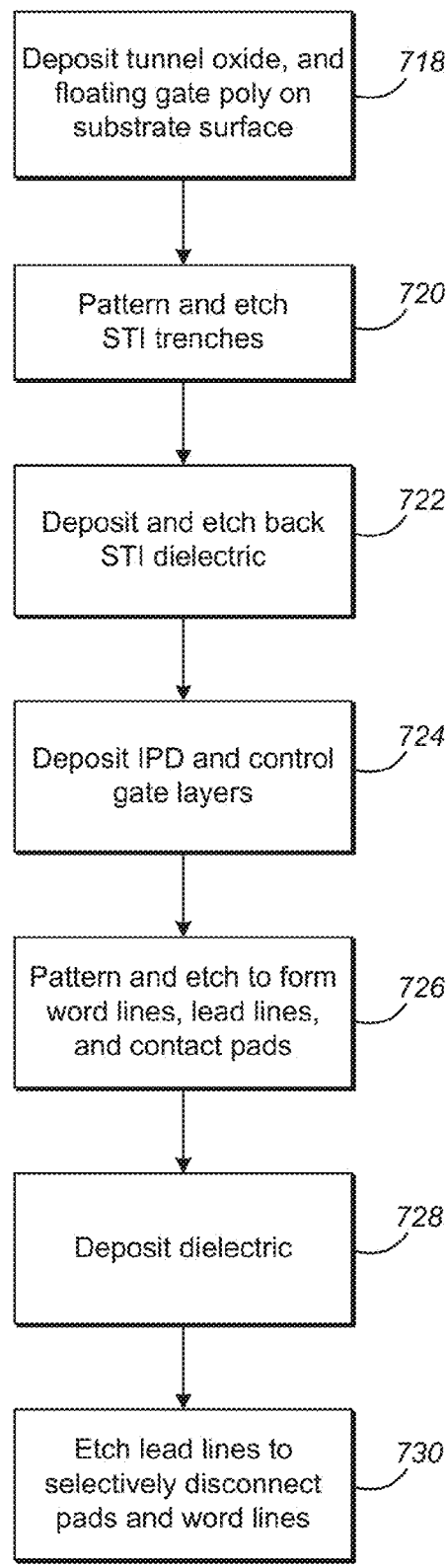
FIG. 27 shows an example of steps used to form a NAND flash memory with low-profile regions in hookup areas.

FIG. 27 illustrates an example of steps that may be used to form a NAND flash memory array as described above. A floating gate polysilicon layer and tunnel oxide layer are deposited 718 on a substrate surface. Patterning and etching 720 are used to form STI trenches including wide STI trenches in the hookup area. Then STI dielectric material is deposited 722 and etched back to form STI structures. IPD layer and control gate layers are deposited 724 and then patterned 726 to form separate word lines, lead lines, and contact pads. A dielectric material is deposited 728 to fill gaps in the hookup area without voids while capping air gaps between word lines. Etching is then performed to selectively cut word lines and contact pads.

Figure 28:
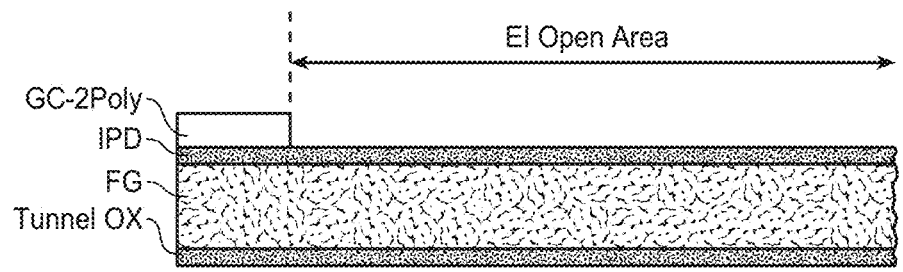
FIG. 28 shows an example of reducing height by etching control gate polysilicon.

While the above examples of process steps may be used, other process steps may also be used to form low-profile areas. For example, as shown in FIG. 28, patterning and etching may be used to remove control gate polysilicon ("GC 2 poly") in an open area so that the height of contact pads and lead lines in such an area is reduced by the control gate polysilicon thickness.

Figure 29:
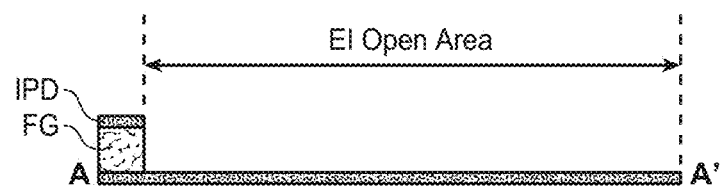
FIG. 29 shows an example of etching through floating gate polysilicon to tunnel oxide.

In some cases, rather than etch partially through floating gate polysilicon as shown in FIG. 9, etching may extend all the way to the underlying tunnel oxide layer as shown in FIG. 29 so that height reduction is equal to the IPD thickness plus the entire floating gate (FG) polysilicon thickness.

Various profiles may be produced at edges of low-profile areas. For example, rather than provide an abrupt step-down from a higher area to a lower area, a stepped (stair-like) or inclined transition region may be provided.

Figure 30:
FIG. 30 illustrates an example of a stepped profile.

FIG. 30 shows a stepped-down profile that may be achieved by alternating resist slimming and etching steps. Thus, after an etch step (e.g. RIE) that removes a portion of floating gate polysilicon, the resist is slimmed so that the open area expands and a larger area is exposed in the next etch step.

Figure 31:
FIG. 31 illustrates an example of a ramped profile.

FIG. 31 shows an example of a ramped-down profile from a relatively high-profile area to a low-profile area. Such a tapered profile may be achieved, for example, by using isotropic etching (e.g. wet etching) instead of, or in addition to, anisotropic etching (e.g. RIE).

CONCLUSION

Although the various aspects have been described with respect to examples, it will be understood that protection within the full scope of the appended claims is appropriate.

It is claimed:

1. A NAND flash memory comprising:
a plurality of word lines in a NAND memory array area;
a plurality of contact pads and lead lines in a word line hookup area, each of the plurality of word lines electrically connected to a corresponding contact pad by a corresponding lead line;
wherein the plurality of word lines in the memory array area have a first height and low-profile areas of one or more lead lines in the word line hookup area have a second height that is less than the first height;
a plurality of cuts through the one or more lead lines, each of the plurality of cuts extending through a corresponding low-profile area of the one or more lead lines to isolate a contact pad from a word line thereby leaving the word line connected only to its corresponding contact pad;
wherein the corresponding low-profile area surrounds an individual cut of the plurality of cuts and the individual cut extends through an individual lead line of the one or more lead lines at least a minimum distance from a perimeter of the corresponding low-profile area; and
a plurality of air gaps separating the plurality of word lines and wherein the plurality of air gaps terminate in the word line hookup area and do not intersect the plurality of cuts.

2. The NAND flash memory of claim 1 wherein the low-profile areas of the one or more lead lines do not include any interpoly dielectric (IPD) thereby reducing the second height relative to the first height by an amount that is at least equal to IPD thickness.

3. The NAND flash memory of claim 2 wherein the low-profile areas of the one or more lead lines contain a reduced thickness of floating gate polysilicon thereby reducing the second height relative to the first height by an amount that is equal to the IPD thickness, plus a portion of floating gate thickness.

4. The NAND flash memory of claim 1 wherein the low-profile areas do not include any floating gate polysilicon thereby reducing the second height relative to the first height by an amount that is equal to floating gate layer thickness.

5. The NAND flash memory of claim 4 wherein shallow trench isolation structures extend under the low-profile areas of the lead lines in the word line hookup area.

6. The NAND flash memory of claim 1 wherein the individual cut extends through a dielectric material that lies between neighboring lead lines.

7. The NAND flash memory of claim 1 wherein the low-profile areas extend so that at least portions of the contact pads have the second height.

8. The NAND flash memory of claim 1 wherein the word line, the corresponding contact pad, and the corresponding lead line form a continuous electrically conductive body.

9. The NAND flash memory of claim 1 wherein the word line includes a metal layer, and the metal layer extends to the corresponding lead line and the corresponding contact pad.

10. A NAND flash memory comprising:
a first plurality of word lines in a NAND memory array area;
a second plurality of word lines in the NAND memory array area;
a plurality of contact pads in a word line hookup area that is adjacent to the NAND memory array area;
a first plurality of electrically conductive elements in the word line hookup area, each of the first plurality of electrically conductive elements electrically connecting an individual word line of the first plurality of word lines with a contact pad of the plurality of contact pads;
a second plurality of conductive elements in the word line hookup area, each of the second plurality of electrically conductive elements electrically connected to an individual word line of the second plurality of word lines;
wherein the first plurality of word lines and the second plurality of word lines in the memory array area have a first height and at least portions of the second plurality of electrically conductive elements in the word line hookup area have a second height that is less than the first height; and
a plurality of air gaps that extend between the first plurality of word lines and the second plurality of word lines in the NAND memory area and terminate in the word line hookup area, the second plurality of conductive elements extending farther in the word line hookup area than the plurality of air gaps, the second plurality of conductive elements terminating at a plurality of cuts that do not intersect the plurality of air gaps.

* * * * *